United States Patent
Ko et al.

(10) Patent No.: US 12,538,584 B2
(45) Date of Patent: Jan. 27, 2026

(54) ELECTROSTATIC DISCHARGE DEVICE AND DISPLAY DRIVING CHIP INCLUDING THE SAME

(71) Applicant: Samsung Electronics Co., Ltd., Suwon-si (KR)

(72) Inventors: Jaehyok Ko, Suwon-si (KR); Changsig Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 642 days.

(21) Appl. No.: 17/899,885

(22) Filed: Aug. 31, 2022

(65) Prior Publication Data

US 2023/0076856 A1    Mar. 9, 2023

(30) Foreign Application Priority Data

Sep. 6, 2021 (KR) .................. 10-2021-0118551
Jun. 13, 2022 (KR) .................. 10-2022-0071725
Aug. 3, 2022 (KR) .................. 10-2022-0096848

(51) Int. Cl.
*H10D 89/60* (2025.01)
*H10D 62/10* (2025.01)

(52) U.S. Cl.
CPC ......... *H10D 89/611* (2025.01); *H10D 62/115* (2025.01); *H10D 62/128* (2025.01); *H10D 62/129* (2025.01); *H10D 89/931* (2025.01)

(58) Field of Classification Search
CPC ............................ H10D 89/611; H10D 89/931
See application file for complete search history.

(56) References Cited

U.S. PATENT DOCUMENTS

| 4,806,999 | A | 2/1989 | Strauss |
| 8,982,516 | B2 | 3/2015 | Gendron et al. |
| 9,318,481 | B1 | 4/2016 | Wang et al. |
| 9,385,115 | B2 | 7/2016 | Notermans et al. |
| 2007/0131965 | A1 | 6/2007 | Kim et al. |
| 2014/0210003 | A1* | 7/2014 | Ko ............... H10D 84/811 438/237 |
| 2016/0035905 | A1* | 2/2016 | Yoo ............... H10D 89/611 257/499 |

(Continued)

FOREIGN PATENT DOCUMENTS

KR    100504203 B1    7/2005

*Primary Examiner* — Britt D Hanley
*Assistant Examiner* — Jason James Greaving
(74) *Attorney, Agent, or Firm* — HARNESS, DICKEY & PIERCE, P.L.C.

(57) ABSTRACT

An electrostatic discharge (ESD) device may include a semiconductor substrate including a first region, a second region, and a device isolation structure. The first region may include a first impurity region having a first conductivity type, a second impurity region having a second conductivity type opposite the first conductivity type, a first base well, and a first well in the first base well. The device isolation structure may be between the first and second impurity regions. The first base well may surround the first impurity region, the second impurity region, and lower portions of the device isolation structure in the substrate. The first well may have the first conductivity type. The first well may be spaced apart from the device isolation structure in a first direction with a portion of the first base well therebetween.

18 Claims, 14 Drawing Sheets

(56) References Cited

U.S. PATENT DOCUMENTS

| | | | |
|---|---|---|---|
| 2018/0364797 A1* | 12/2018 | Kojima | H03K 19/00361 |
| 2020/0098741 A1 | 3/2020 | Zeng | |
| 2021/0066286 A1 | 3/2021 | Tsai et al. | |
| 2021/0234052 A1* | 7/2021 | Singh | H10D 62/117 |
| 2022/0068908 A1* | 3/2022 | Lin | H10D 89/60 |
| 2023/0317835 A1* | 10/2023 | Mahajan | H10D 89/60 257/584 |

* cited by examiner

ELECTROSTATIC DISCHARGE DEVICE AND DISPLAY DRIVING CHIP INCLUDING THE SAME

CROSS-REFERENCE TO RELATED APPLICATIONS

This application is based on and claims priority under 35 U.S.C. § 119 to Korean Patent Application Nos. 10-2021-0118551, filed on Sep. 6, 2021, 10-2022-0071725, filed on Jun. 13, 2022, and 10-2022-0096848, filed on Aug. 3, 2022 in the Korean Intellectual Property Office, the disclosures of which are incorporated by references herein in their entireties.

BACKGROUND

Inventive concepts relate to an electrostatic discharge (ESD) device, and more particularly, to an ESD device having a diode structure and/or a display driving chip including the ESD device.

A semiconductor device may be momentarily exposed to ESD of several thousand volts or more for various reasons. When the semiconductor device is exposed to ESD, the semiconductor device may be destroyed or damaged due to destruction of a gate insulating film of a transistor in the semiconductor device or junction spiking at a metal-silicon junction. Accordingly, the ESD may seriously affect the reliability of the semiconductor device. In order to limit and/or prevent damage caused by ESD, an ESD device or an ESD protection circuit is generally used in electronic devices. Recently, as electronic devices are highly integrated, the chip size continues to decrease. Accordingly, research to reduce the size of the ESD device or the ESD protection circuit while maintaining an ESD resistance is continuously being conducted.

SUMMARY

Inventive concepts provide an electrostatic discharge (ESD) device having a small size and improved reliability, and/or a display driving chip including the ESD device.

According to an embodiment of inventive concepts, an ESD device may include a semiconductor substrate including a first impurity region having a first conductivity type, a second impurity region having a second conductivity type, a first base well, and a first well in the first base well, the second conductivity type opposite the first conductivity type; and a device isolation structure between the first impurity region and the second impurity region. The first base well may surround the first impurity region, the second impurity region, and lower portions of the device isolation structure in the semiconductor substrate. The first well may have the first conductivity type. The first well may be spaced apart from the device isolation structure in a first direction with a portion of the first base well therebetween.

According to an embodiment of inventive concepts, an ESD may include a semiconductor substrate and a device isolation structure. The semiconductor substrate may include a first region and a second region. The first region may include a first region base well having a first conductivity type, a first well having the first conductivity type in the first region base well, and a first impurity region having the first conductivity type on the first well and connected to a first electrode. The second region may include a second region base well having a second conductivity type, and a second impurity region having the second conductivity type and connected to a second electrode on the second region base well. The second conductivity type may be opposite the first conductivity type. The device isolation structure may be between the first impurity region and the second impurity region. The first region and the second region may be spaced apart from each other in a first direction.

According to an embodiment of inventive concepts, a display driving chip may include a circuit area; an input area; and an output area. The output area may include a plurality of cells including an electrostatic discharge (ESD) device. The ESD device may include a P-type semiconductor substrate, an N-type base well in the P-type semiconductor substrate, a first region base well having a first conductivity type in the N-type base well, a second region base well having a second conductivity type in the N-type base well, the second conductivity type being opposite the first conductivity type, a first well having the first conductivity type in the first region base well, a second well having the second conductivity type in the second region base well, a first impurity region having the first conductivity type on the first well and connected to a first electrode, a second impurity region having the second conductivity type and connected to a second electrode on the second well, a device isolation structure between the first impurity region and the second impurity region, and a silicide prevention structure at least partially overlapping the first impurity region and the device isolation structure on the first impurity region and the device isolation structure. The first region base well and the second region base well may be spaced apart from each other in a first direction in the N-type base well. The first well may be spaced apart from the device isolation structure in the first direction in the first region base well.

BRIEF DESCRIPTION OF THE DRAWINGS

Embodiments will be more clearly understood from the following detailed description taken in conjunction with the accompanying drawings in which.

DETAILED DESCRIPTION

Figure 1:
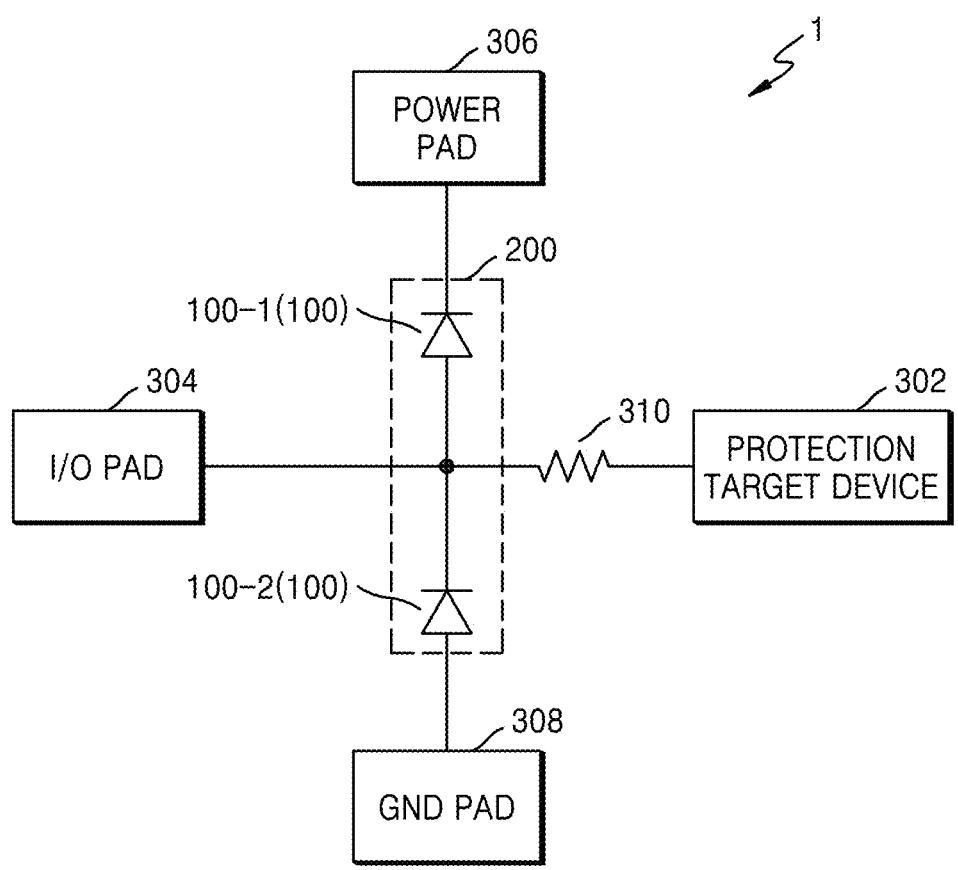
FIG. 1 is an equivalent circuit diagram for an electrostatic discharge (ESD) protection circuit according to some embodiments.

Hereinafter, embodiments will be described in detail with reference to the accompanying drawings. The same reference numerals are used for the same components in the drawings, and descriptions already given for the same components are omitted.

FIG. 1 is an equivalent circuit diagram of an electrostatic discharge (ESD) protection circuit 1 according to example embodiments.

Referring to FIG. 1, the ESD protection circuit 1 may include an ESD device 100. In some embodiments, the ESD device 100 may be formed on a substrate (refer to 110 of FIG. 3A) together with a protection target device 302. In some embodiments, a signal voltage may be applied to the protection target device 302 through an input/output (I/O) pad 304.

According to example embodiments, the ESD protection circuit 1 may include two or more ESD devices 100. For example, the ESD protection circuit 1 may include a dual-diode structure having two ESD devices 100. For example, the two ESD devices 100 may be connected to each other in series.

According to example embodiments, the ESD device 100 may be a first ESD device 100-1 having a p-type diode structure or a second ESD device 100-2 having an n-type diode structure. According to example embodiments, the ESD protection circuit 1 may include a first ESD device 100-1 and a second ESD device 100-2.

In some embodiments, the ESD protection circuit 1 may include a plurality of first ESD devices 100-1 and a plurality of second ESD devices 100-2. In this case, the plurality of first ESD devices 100-1 may be connected to each other in parallel, and similarly, the plurality of second ESD devices 100-2 may be connected to each other in parallel.

According to example embodiments, an anode terminal of the first ESD device 100-1 may be electrically connected to an I/O pad 304, and a cathode terminal of the first ESD device 100-1 may be electrically connected to a power pad 306. According to example embodiments, an anode terminal of the second ESD device 100-2 may be electrically connected to the ground pad 308, and a cathode terminal may be electrically connected to the I/O pad 304. According to example embodiments, the I/O pad 304 may be configured to be electrically connected to the protection target device 302 to apply a signal voltage to the protection target device 302, and may be commonly connected to the anode of the first ESD device 100-1 and the cathode of the second ESD device 100-2.

According to example embodiments, the ESD protection circuit 1 may be configured to limit and/or prevent electrostatic current from flowing to the protection target device 302, by including the ESD devices. In some embodiments, static electricity may be introduced into the ESD protection circuit 1 through the I/O pad 304. In some embodiments, positive (+) static electricity may flow in a forward direction of the first ESD device 100-1 (i.e., forward bias) and may escape to a terminal to which the power supply voltage Vdd is applied. In this case, the second ESD device 100-2 may be reverse biased, the positive (+) static electricity may be cut off by the second ESD device 100-2 to limit and/or prevent the positive (+) static electricity from flowing in the reverse direction. In some embodiments, when negative (−) static electricity is applied to I/O pad 304, negative (−) static electricity may flow in a forward direction of the second ESD device 100-2 and may escape to a terminal to which the ground voltage Vss is applied. In this case, the first ESD device 100-1 may be biased in the reverse direction to block negative (−) static electricity from flowing in the reverse direction. The ESD device 100 according to example embodiments may implement a low on-resistance when a forward voltage is applied to ESD device 100 while reducing the size of the ESD device 100, as described below, and may maintain a high breakdown voltage when reverse voltage is applied to EDS device 100.

In some embodiments, a resistance element 310 for more safely protecting the protection target device 302 may be added to the front end of the protection target device 302. In some embodiments, the resistance element 310 may be added to the front end of the protection target device 302 as a separate component from the ESD protection circuit 1, and may be included as one configuration of the ESD protection circuit 1.

In some embodiments, the first ESD device 100-1 and the second ESD device 100-2 may be included in a cell 200, and the cell 200 may be configured as one unit that performs an ESD protection function. In some embodiments, the cell 200 may be configured as a unit further including the I/O pad 304 and the resistance element 310.

In some embodiments, the protection target device 302 may include all types of electrical and electronic devices that need protection from ESD. For example, the protection target device 302 may include various semiconductor devices, such as various memory devices, such as DRAM and flash, logic devices constituting controllers, and interface devices for data communication.

On the other hand, according to the ESD characteristics of the protection target device 302, a model in which the protection target device 302 is damaged may be classified into a human body model (HBM) and a charged device model (CDM). Here, the HBM may be a case in which a charged person generates ESD in the protection target device 302 to damage the protection target device 302, and the CDM may mean a case where the protection target device 302 itself is charged and the protection target device 302 generates ESD in a conductor, such as a human body or a metal, and the protection target device 302 is damaged. The ESD protection device 100 according to example embodiments may be used for both the HBM and the CDM.

Figure 2A:
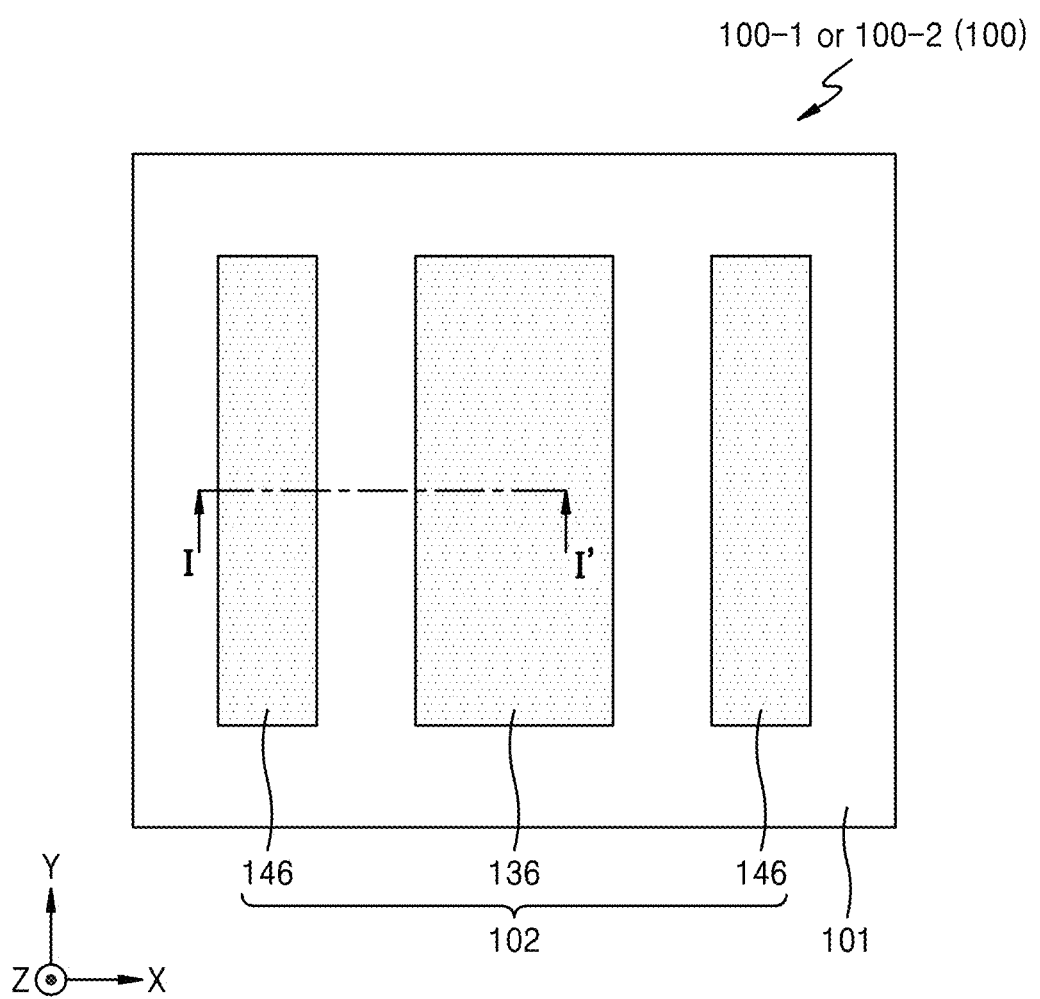
FIGS. 2A and 2B are plan views schematically illustrating the shape of an impurity region in an ESD device according to some embodiments.
Figure 2B:
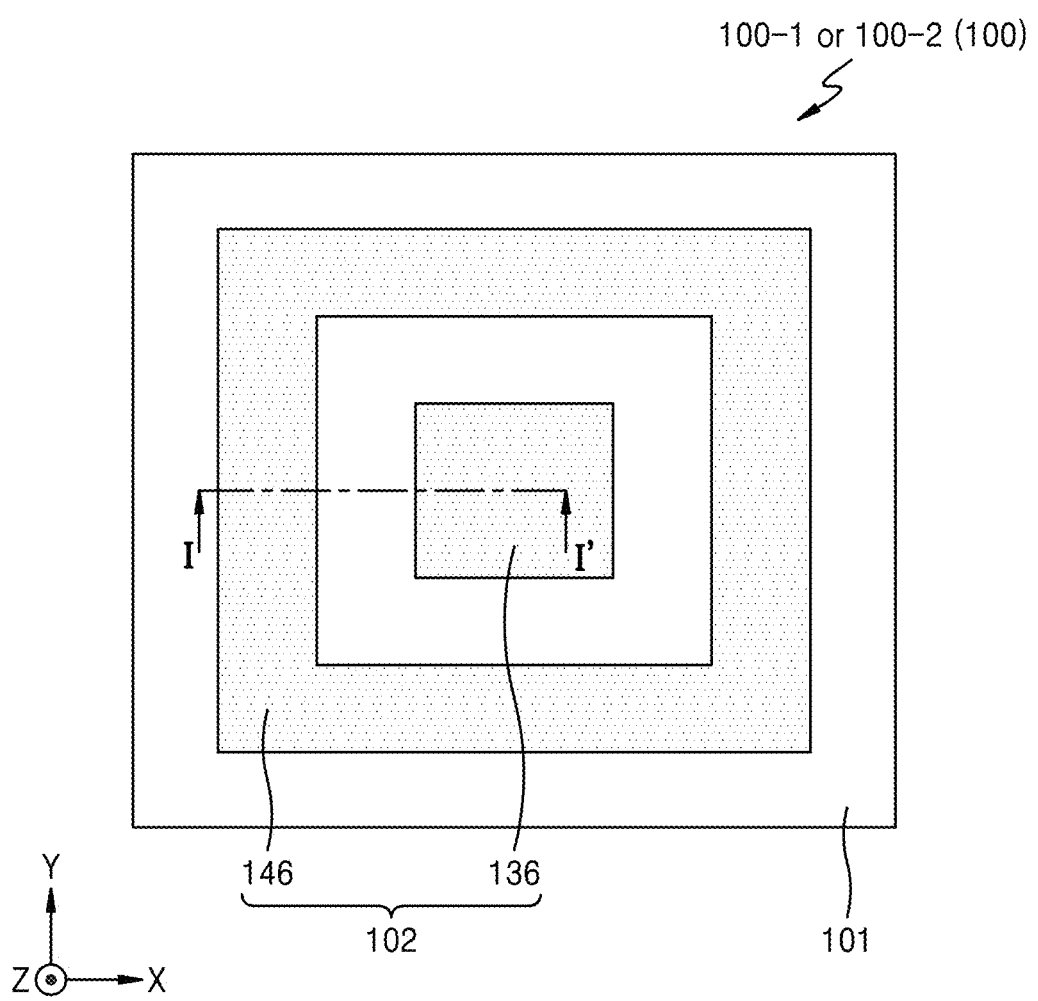

FIGS. 2A and 2B are plan views illustrating an ESD protection device 100 according to example embodiments.

Referring to FIGS. 2A and 2B, the ESD protection device 100 may include a field region 101 and an active region 102. According to example embodiments, the active region 102 may include a first impurity region 136 and a second impurity region 146. According to example embodiments, the first impurity region 136 may have a first conductivity type, and the second impurity region 146 may have a second conductivity type, wherein the second conductivity type is opposite the first conductivity type. According to example embodiments, the field region 101 may be disposed to surround the active region 102, and may be configured such that the first impurity region 136 and the second impurity region 146 are spaced apart from each other. According to example embodiments, the field region 101 between the first impurity region 136 and the second impurity region 146 may serve as a device isolation structure (refer to 152 of FIG. 3A).

Referring to FIG. 2A, the second impurity region 146 may be disposed to be spaced apart from the first impurity region 136 in a first direction (an X-direction). In some embodiments, the ESD protection device 100 may have a bar-type structure in which the first impurity region 136 and the second impurity region 146 extend in a second direction (a Y direction) perpendicular to the first direction. In some embodiments, the second impurity regions 146 may be disposed on both sides of the first impurity region 136, which is placed at the center of the second impurity regions, to be spaced apart from each other in the first direction (an X direction).

Referring to FIG. 2B, the second impurity regions 146 may be spaced apart from the first impurity region 136 in a horizontal direction (an X-direction, a Y-direction, or a combination thereof) and may be disposed to surround the first impurity region 136. In some embodiments, the ESD protection device 100 may have a wrap around-type structure in which the first impurity region 136 is disposed in the center and the second impurity region 146 surrounds the first impurity region 136 in a ring shape.

According to example embodiments, in the case of the first ESD device 100-1, the conductivity type of the first impurity region 136 may be P-type, and the conductivity type of the second impurity region 146 may be N-type. According to example embodiments, in the case of the second ESD device 100-2, the conductivity type of the first impurity region 135 may be N-type, and the conductivity type of the second impurity region 146 may be P-type.

Figure 3A:
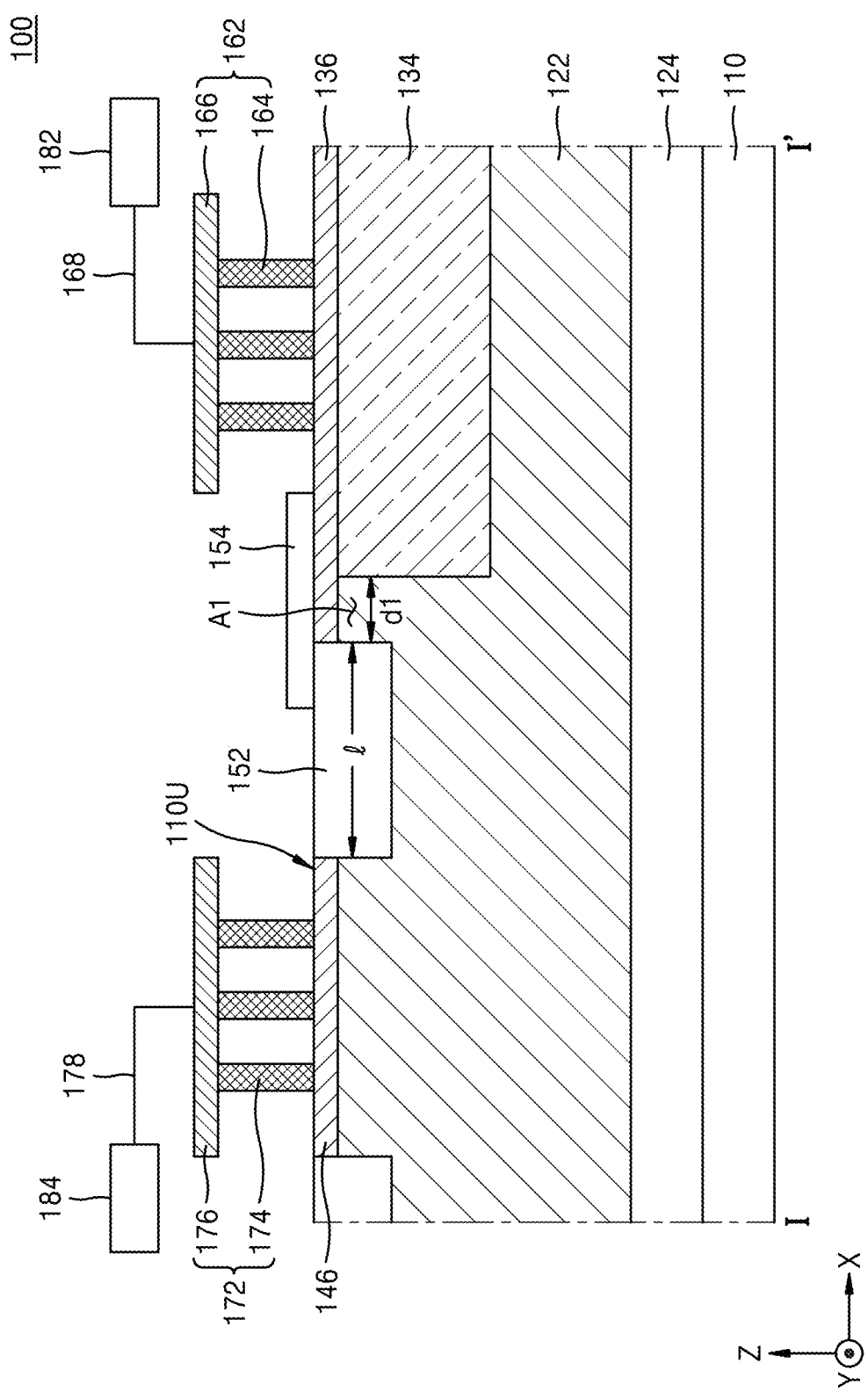
FIG. 3A is a cross-sectional view taken along line I-I' of an ESD device according to some embodiments having plan views of FIGS. 2A and 2B.

FIG. 3A is a cross-sectional view taken along line I-I' of the ESD device 100 according to some embodiments having the plan view of FIG. 2A or 2B.

Referring to FIG. 3A, the ESD device 100 may include a semiconductor substrate 110, a first base well 122, a first impurity region 136, a first well 134, a second impurity region 146, and a device isolation structure 152.

According to example embodiments, the first base well 122 may be formed in the semiconductor substrate 110. The first impurity region 136 and the second impurity region 146 may be formed on the first base well 122, and may be exposed on the upper surface 110U of the semiconductor substrate 110. According to example embodiments, the first well 134 may be disposed under the first impurity region 136 in the first base well 122. According to example embodiments, the device isolation structure 152 may be disposed between the first impurity region 136 and the second impurity region 146, so may be configured to electrically isolate the first impurity region 136 and the second impurity region 146.

According to example embodiments, the first impurity region 136 and the second impurity region 146 may be spaced apart from each other in the first direction (the X direction) with the device isolation structure 152 therebetween. For example, the side surfaces of the first impurity region 136 and the second impurity region 146 may contact the device isolation structure 152, respectively. For example, side surfaces of the first impurity region 136 and the second impurity region 146 may face each other with the device isolation structure 152 therebetween.

According to example embodiments, the first impurity region 136 may include a portion that does not overlap the first well 134 in the vertical direction (the Z direction). According to example embodiments, the first well 134 may be spaced apart from the device isolation structure 152 by a first distance d1 in the first direction (the X direction). For example, the first well 134 may be spaced apart from the device isolation structure 152 under the first impurity region 136. According to example embodiments, a first separation area A1 may be formed between the first well 134 and the device isolation structure 152. For example, the first separation area A1 may be disposed under the first impurity region 136.

According to example embodiments, the first base well 122 may surround lower portions of the first impurity region 136 and the second impurity region 146, and may surround the lower portions and sides of the device isolation structure 152 and the first well 134. According to example embodiments, the first base well 122 may be disposed in the first separation area A1. For example, one side of the device isolation structure 152 may face the first well 134 with the first base well 122 therebetween.

According to example embodiments, the first base well 122 may integrally cover the lower portions of the first impurity region 136, the second impurity region 146, the device isolation structure 152, and the first well 134.

According to example embodiments, the first impurity region 136 may have a first conductivity type, and the second impurity region 146 may have a second conductivity type. In some embodiments, the first well 134 may have the same conductivity type as the first impurity region 136, and may have a lower impurity concentration than that of the first impurity region 136.

According to some embodiments, the first base well 122 may have a first conductivity type or a second conductivity type. In some embodiments, the first base well 122 may have the same first conductivity type as the first impurity region 136. In this case, the first base well 122 may have a lower impurity concentration than that of the first well 134. In some other embodiments, the first base well 122 may have the same second conductivity type as the second impurity region 146. In this case, the first base well 122 may have a lower impurity concentration than that of the second impurity region 146. For example, when the first base well 122 has the second conductivity type, a PN junction may be formed at a portion where the first impurity region 136 and the first base well 122 contact each other.

According to example embodiments, the ESD device 100 may further include a second base well 124. According to example embodiments, the second base well 124 may be formed in the semiconductor substrate 110 and may be formed to surround the first base well 122. For example, the first base well 122 may be formed in the second base well 124. According to example embodiments, the second base well 124 may have a first conductivity type or a second conductivity type. For example, the second base well 124 may have an N-type. In some other embodiments, the second base well 124 may have a P-type.

According to example embodiments, the semiconductor substrate 110 may be a substrate doped with impurities. For example, the semiconductor substrate 110 may be a P-type substrate. In some other embodiments, the semiconductor substrate 110 may be an N-type substrate.

According to example embodiments, the ESD device 100 may further include a silicide prevention structure 154 configured to limit and/or prevent a current crowding effect during an ESD operation. According to example embodiments, the silicide prevention structure 154 may be disposed on the upper surface 110U of the semiconductor substrate 110 to at least partially overlap the device isolation structure 152 and the first impurity region 136. For example, the silicide prevention structure 154 may cover the first separation area A1.

According to example embodiments, the ESD device 100 may include a first electrode 168 connected to the first impurity region 136 and a second electrode 178 connected to the second impurity region 146. In some embodiments, the first impurity region 136 may be electrically connected to the first electrode 168 through a first contact structure 162, and the second impurity region 146 may be electrically connected to the second electrode 178 through a second contact structure 172. In some embodiments, the first contact structure 162 may include a plurality of first contact pillars 164 in contact with the upper surface 110U of the first impurity region 136 and a first contact line 166 configured to electrically connect the plurality of first pillars 164 to the first electrode 168. In some embodiments, the second contact structure 172 may include a plurality of second contact pillars 174 in contact with the upper surface 110U of the second impurity region 146 and a second contact line 176 configured to electrically connect the plurality of second contact pillars 174 to the second electrode 178. In some embodiments, the ESD device 100 may further include an insulating layer (not shown) covering the upper surface 110U of the semiconductor substrate 110 and surrounding the first contact structure 162 and the second contact structure 172.

According to example embodiments, the first impurity region 136 may be electrically connected to a first pad 182 through the first electrode 168, and the second impurity region 146 may be electrically connected to a second pad 184 through the second electrode 178. According to example embodiments, the first electrode 168 and the second electrode 178 may be configured to act as anode and cathode, or cathode and anode, respectively. According to example embodiments, each of the first pad 182 and the second pad 184 may be any one of a power pad 306, an I/O pad 304, and a ground pad 308.

In some embodiments, in the case of the first ESD device 100-1, the first conductivity type may be a P-type, and the second conductivity type may be an N-type. In some embodiments, the first pad 182 may be an I/O pad 304, and a signal voltage may be applied to the first pad 182. In this case, the first electrode 168 may act as an anode. In some embodiments, the second pad 184 may be a power pad 306, and a power voltage may be applied to the second pad 184. In this case, the second electrode 178 may act as a cathode.

In some embodiments, in the case of the second ESD device 100-2, the first conductivity type may be an N-type, and the second conductivity type may be a P-type. In some embodiments, the first pad 182 may be an I/O pad 304, and a signal voltage may be applied to the first pad 182. In this case, the first electrode 168 may act as a cathode. In some embodiments, the second pad 184 may be a ground pad 308, and a ground voltage may be applied to the second pad 184. In this case, the second electrode 178 may act as an anode.

In some embodiments, in the second ESD device 100-2, the first conductivity type may be a P-type, and the second conductivity type may be a N-type. In some embodiments, the first pad 182 may be a ground pad 308, and a ground voltage may be applied to the first pad 182. In this case, the first electrode 168 may act as an anode. In some embodiments, the second pad 184 may be an I/O pad 304, and a signal voltage may be applied to the second pad 184. In this case, the second electrode 178 may act as a cathode. For example, the first ESD device 100-1 may have an impurity region and a well structure having substantially the same structure as those of the second ESD device 100-2, and only the first electrode 168 and the second electrode 178 of the first and second ESD devices 100-1 and 100-2 may be electrically connected to different pads.

Figure 3B:
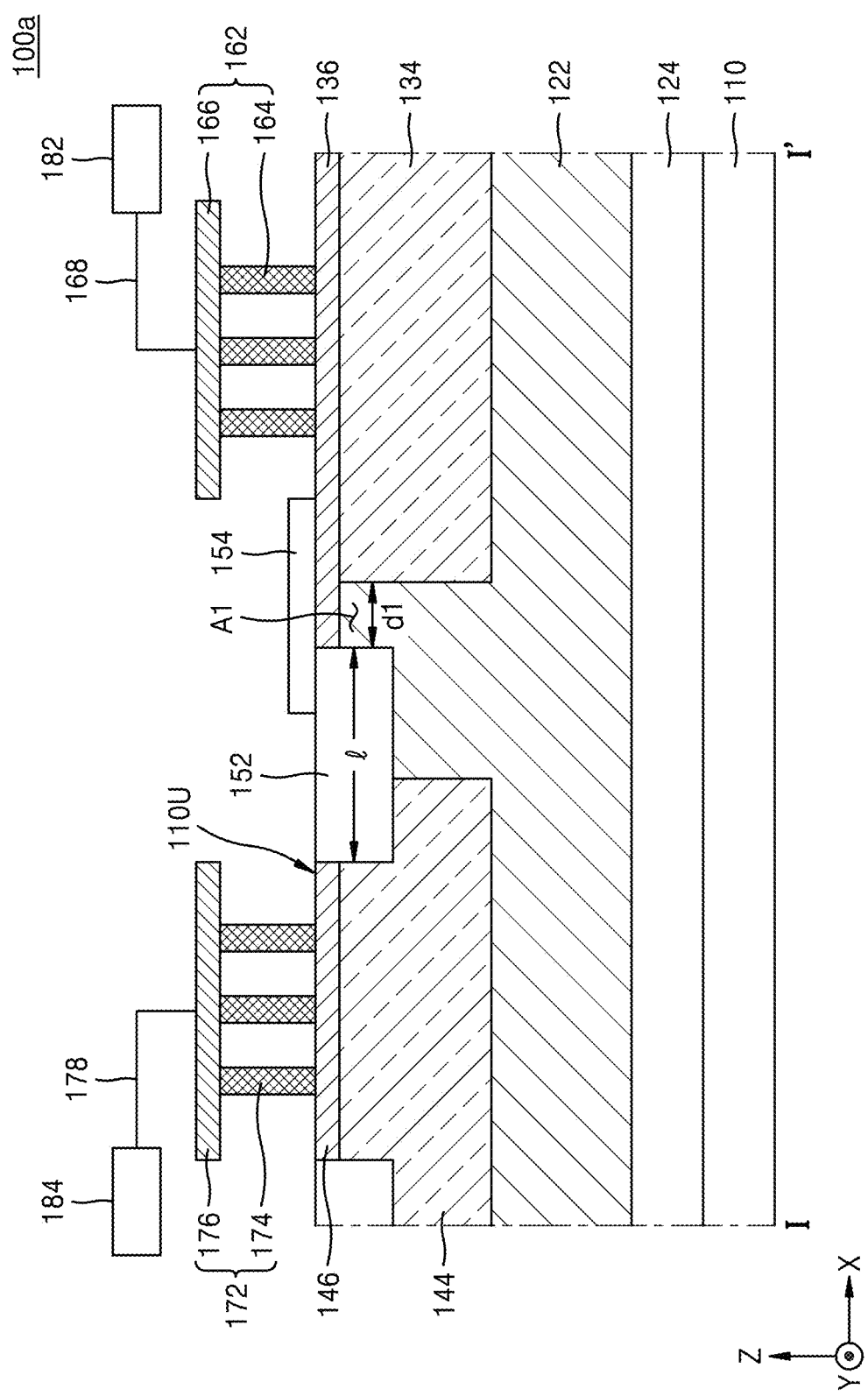
FIG. 3B is a cross-sectional view taken along line I-I' of the ESD device according to some embodiments having plan views of FIGS. 2A and 2B.

FIG. 3B is a cross-sectional view taken along line I-I' of the ESD device 100a according to some other embodiments having the plan views of FIG. 2A or 2B. The difference between FIGS. 3A and 3B is whether the ESD device includes a second well 144. Hereinafter, the above difference will be mainly described.

Referring to FIG. 3B, the second well 144 may be formed in the first base well 122 and may be disposed under the second impurity region 146. In this case, the first base well 122 may surround lower portions and sides of the second well 144.

According to example embodiments, the vertical depth of the second well 144 may be greater than the vertical depth of the device isolation structure 152. In example embodiments, the device isolation structure 152 may partially overlap the second well 144 in the vertical direction (the Z direction). For example, the second well 144 may partially surround the side and lower portions of the device isolation structure 152.

According to example embodiments, a second well 144 may be spaced apart from the first well 134 in the first direction (X direction). According to example embodiments, the side boundary of the second well 144 may be formed under the device isolation structure 152 and may be spaced apart from the side boundary of the first well 134 in the first direction (X direction).

FIG. 3B illustrates that the lower surface of the first well 134 and the lower surface of the second well 144 are positioned at the same level in the vertical direction (the Z direction), but is not limited thereto. For example, a lower surface of the first well 134 may be vertically positioned at a level lower than a lower surface of the second well 144. For example, the lower surface of the first well 134 may be vertically positioned at a higher level than the lower surface of the second well 144.

According to example embodiments, the second well 144 may have the same conductivity type as the second impurity region 146, and may have a lower impurity concentration than that of the second impurity region 146.

Figure 3C:
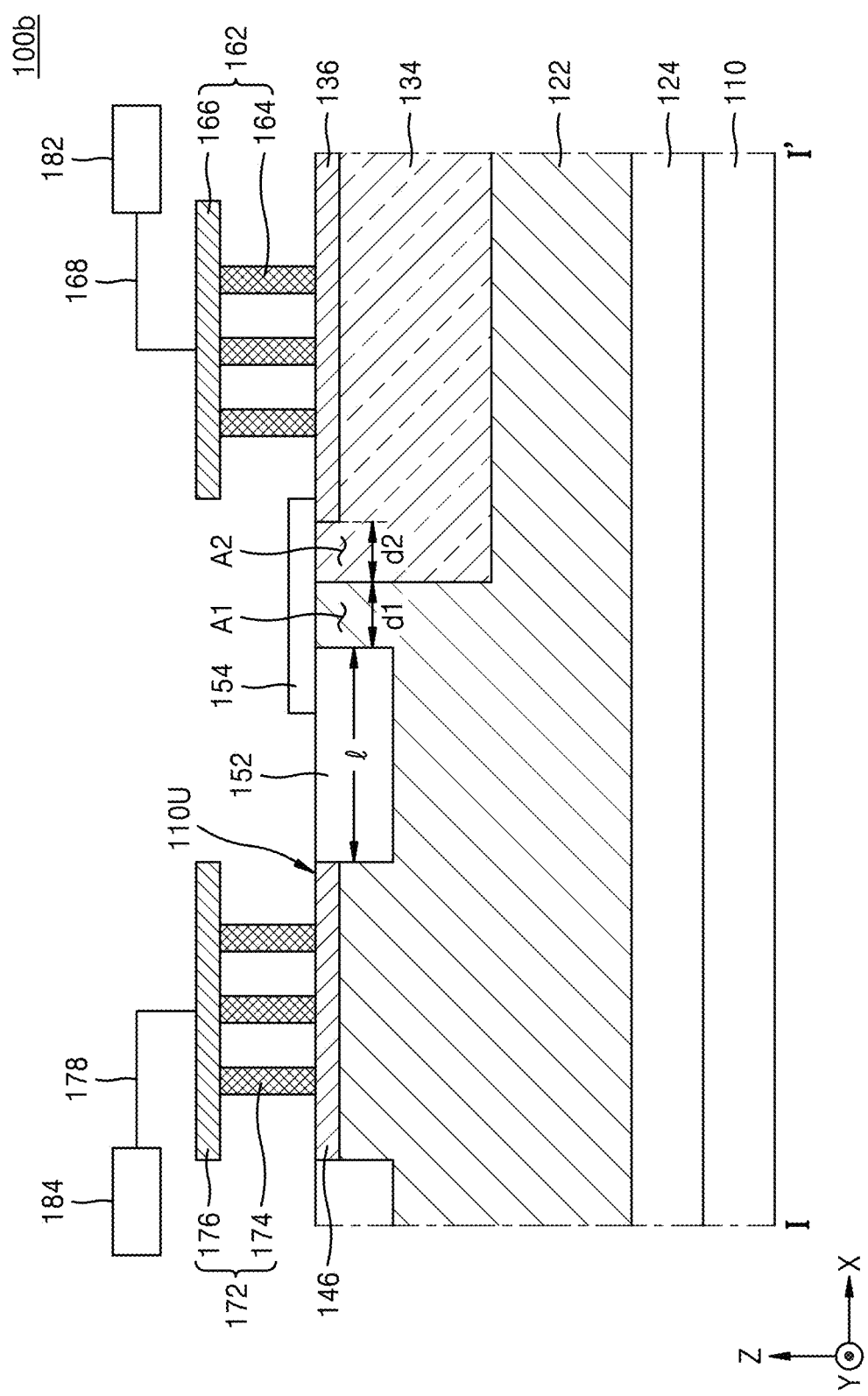
FIG. 3C is a cross-sectional view taken along line I-I' of the ESD device according to some embodiments having plan views of FIGS. 2A and 2B.

FIG. 3C is a cross-sectional view taken along line I-I' of the ESD device 100b according to some other embodiments having the plan view of FIG. 2A or 2B. The difference between FIGS. 3A and 3C is whether the first impurity region 136 is spaced apart from the device isolation structure 152 in the first direction (the X direction). Hereinafter, the above differences will be mainly described.

Referring to FIG. 3C, the first impurity region 136 may be spaced apart from the device isolation structure 152 in the first direction (the X direction). For example, the first impurity region 136 may not contact the device isolation structure 152.

According to example embodiments, a separation distance in the first direction (X direction) between the first impurity region 136 and the device isolation structure 152 may be greater than the first distance d1 that is the separation distance in the first direction (X direction) between the first well 134 and the device isolation structure 152.

In example embodiments, the first impurity region 136 may be formed in the first well 134. In example embodiments, the first well 134 may surround the side and lower portions of the first impurity region 136. For example, the first separation area A1 may not overlap the first impurity region 136 in the vertical direction (Z direction).

In example embodiments, the side surface of the first impurity region 136 may be spaced apart from the side boundary of the first well 134 by a second distance d2 in the first direction (X direction). For example, a side boundary of the first well 134 may be a boundary of the first well 134 facing the first separation area A1. For example, the first impurity region 136 may be spaced apart from the device isolation structure 152 in the first direction (the X direction) by a distance obtained by adding the first distance d1 and the second distance d2.

According to example embodiments, in the first direction (the X direction), a second separation area A2 between a side boundary of the first impurity region 136 and a side boundary of the first well 134 may be formed. For example, a portion of the first well 134 may be disposed in the second separation area A2. For example, the first impurity region 136 may be spaced apart from the device isolation structure 152 in the first direction (the X direction) with the first base well 122 of the first separation area A1 and the first well 134 of the second separation area A2 therebetween.

In example embodiments, the silicide prevention structure 154 may partially cover the device isolation structure 152 and the first impurity region 136. For example, the silicide prevention structure 154 may cover the first separation region A1 and the second separation region A2 between the device isolation structure 152 and the first impurity region 136.

In some embodiments, the first distance d1 may be greater than the second distance d2. In some other embodiments, the first distance d1 may be less than the second distance d2.

Figure 3D:
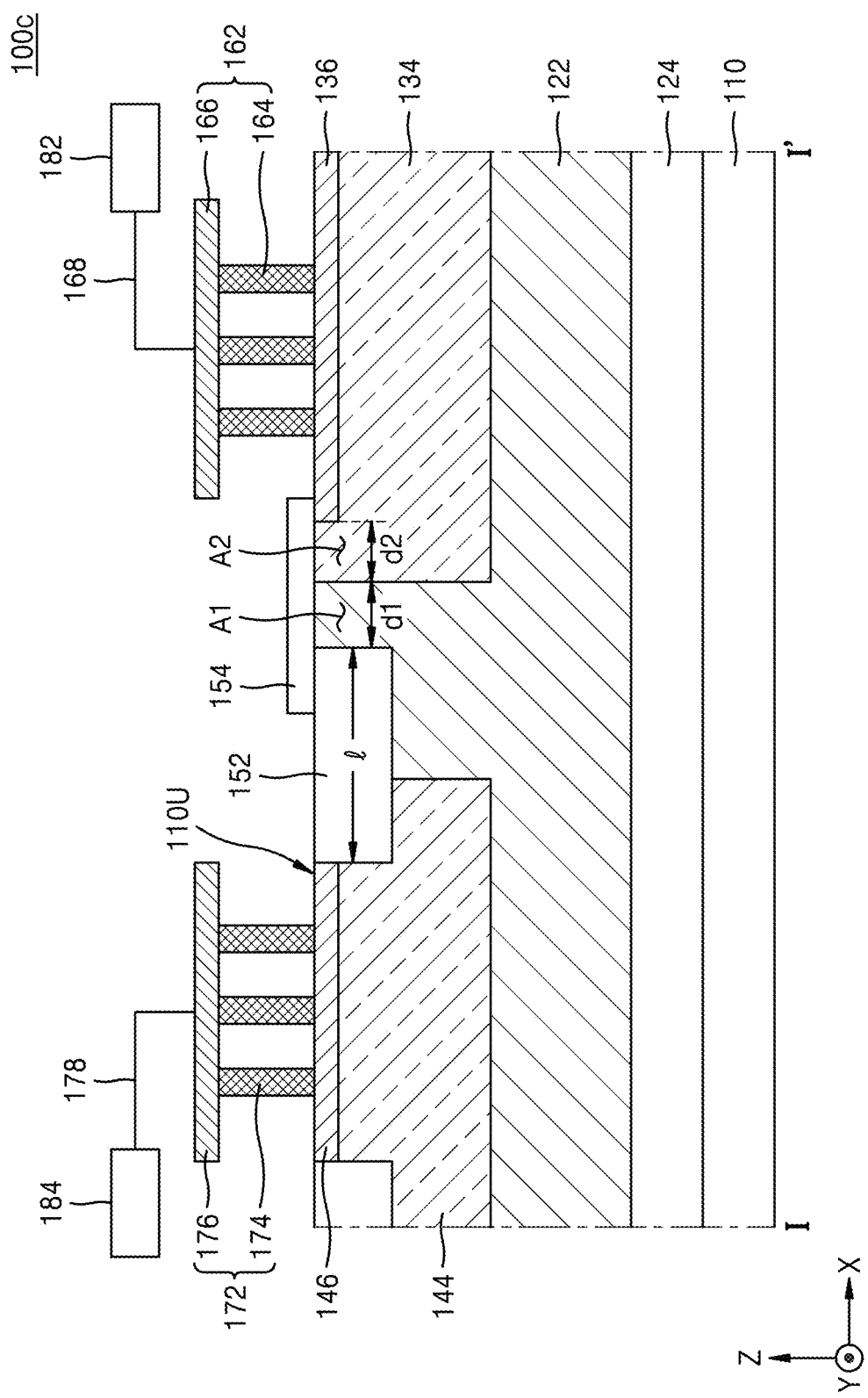
FIG. 3D is a cross-sectional view taken along line I-I' of the ESD device according to some embodiments having plan views of FIGS. 2A and 2B.

FIG. 3D is a cross-sectional view taken along line I-I' of the ESD device 100c according to some other embodiments having the plan view of FIG. 2A or 2B. The difference between FIGS. 3D and 3C is whether the ESD device 100c includes the second well 144. The difference between FIGS. 3D and 3C may be understood from the same viewpoint as the above-described difference between FIGS. 3B and 3A.

Figure 3E:
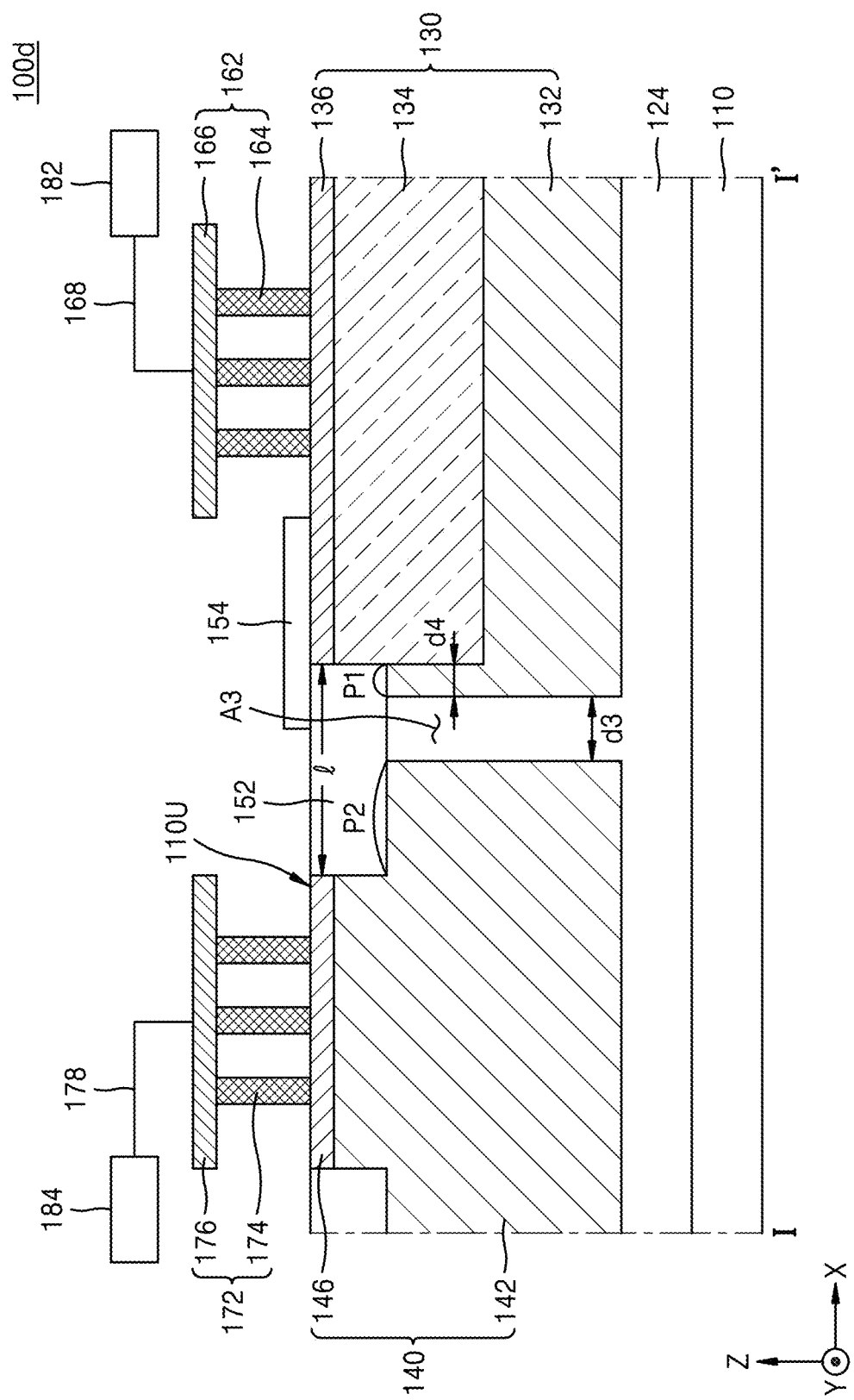
FIG. 3E is a cross-sectional view taken along line I-I' of the ESD device according to some embodiments having the plan views of FIGS. 2A and 2B.

FIG. 3E is a cross-sectional view taken along line I-I' of the ESD device 100d according to some other embodiments having the plan view of FIG. 2A or 2B. The difference between FIGS. 3A and 3E is whether the first base well 122 includes a first region base well 132 and a second region base well 142 spaced apart from each other and whether the first well 134 is in contact with the device isolation structure 152.

Referring to FIG. 3E, a first region 130 and a second region 140 having different conductivity types may be formed in the semiconductor substrate 110. For example, the first region 130 may have a first conductivity type, and the second region 140 may have a second conductivity type opposite the first conductivity type. According to example embodiments, the first region 130 and the second region 140 may be disposed in the second base well 124. For example, the second base well 124 may surround lower portions and sides of the first region 130 and the second region 140.

According to example embodiments, the first base well 122 may include a first region base well 132 and the second region base well 142. According to example embodiments, the first region base well 132 may be disposed in the first region 130, and the second region base well 142 may be disposed in the second region 140. For example, the first region base well 132 may have a first conductivity type, and the second region base well 142 may have a second conductivity type.

According to example embodiments, the first impurity region 136 may be formed on the first region base well 132. For example, the first impurity region 136 may be formed on the uppermost portion of the first region 130, and may be exposed on the upper surface 110U of the semiconductor substrate 110. According to example embodiments, the second impurity region 146 may be formed on the second region base well 142. For example, the second impurity region 146 may be formed on the uppermost portion of the second region 140, and may be exposed on the upper surface 110U of the semiconductor substrate 110.

According to example embodiments, the first region 130 and the second region 140 may be spaced apart from each other in the first direction (the X direction).

According to example embodiments, the first impurity region 136 may be spaced apart from the second impurity region 146 in the first direction with the device isolation structure 152 therebetween. For example, the first impurity region 136 may be spaced apart from the second impurity region 146 in the first direction (the X direction) by the width length l in the first direction (X direction) of the device isolation structure 152.

According to example embodiments, the first region base well 132 may be spaced apart from the second region base well 142 by a third distance d3 in the first direction (the X direction) under the device isolation structure 152. For example, a third separation area A3 may be formed between the first region base well 132 and the second region base well 142 under the device isolation structure 152. For example, the second base well 124 may be disposed in the third separation area A3.

According to example embodiments, the device isolation structure 152 may partially overlap the first region base well 132 and the second region base well 142 in the vertical direction (the Z direction). According to example embodiments, the device isolation structure 152 may include a first portion P1 that overlap the first region base well 132 and a second portion P2 that overlap the second region base well 142. For example, the third distance d3 may be a distance in the first direction (the X direction) between the first portion P1 and the second portion P2.

In some embodiments, the vertical direction (Z direction) thickness of the device isolation structure 152 may be greater than the vertical direction thickness of the first impurity region 136 and the second impurity region 146, and the first region base well 132 and the second region base well 142 may partially surround the side and lower portions of the device isolation structure 152, respectively.

According to example embodiments, the ESD device 100d may include a first region 130 and a second region 140 spaced apart from each other, thus the breakdown voltage of the ESD device 100d may increase even when the width length l in the first direction (the X direction) of the device isolation structure 152 is decreased. When decreasing the first direction (the X direction) width length l of the device isolation structure 152 in order to reduce the size of the ESD device 100d, if there is no third separation area A3, the breakdown voltage of the ESD device 100d may be reduced, and thus the protection target device 302 may be damaged when static electricity is introduced.

According to example embodiments, the first well 134 may be disposed in the first region base well 132. According to example embodiments, the first impurity region 136 may be disposed on the first well 134. According to example embodiments, the lower surface of the first well 134 may be positioned at a lower level than the lower surface of the device isolation structure 152 in the vertical direction (the Z direction).

According to example embodiments, the first region 130 may have a multi-well structure having a first conductivity type. According to example embodiments, the concentration of the impurities doped in the first region 130 may decrease as the distance from the upper surface 110U in the vertical direction (Z direction) increases. According to example embodiments, an impurity concentration of the first impurity region 136 may be greater than an impurity concentration of the first well 134, and an impurity concentration of the first well 134 may be greater than an impurity concentration of the first region base well 132. According to example embodiments, the concentration of the impurity may be substantially continuously decreased as the distance increases from the upper surface 110U of the semiconductor substrate 110 in the vertical direction (the Z direction). Accordingly, the resistance of the first region 130 may be reduced in a vertical view, and a vertical current flow may be induced in the first region 130.

For example, the ESD current may flow from the first region 130 to the second region 140 through the third separation area A3 under the device isolation structure 152. In some embodiments, because the first region 130 has a multi-well structure configured to have a lower impurity concentration as the distance from the upper surface 110U of the semiconductor substrate 110 in the vertical direction increases, a current flow concentrated on a direct lower surface of the device isolation structure 152 may be distributed in a vertical direction (e.g., the direction away from the upper surface 110U of the semiconductor substrate 110). For example, in addition to the direct lower surface of the device isolation structure 152, a current path flowing to a lower region may be formed. In this case, concentration of current to a region adjacent to the device isolation structure 152 among the second region 140 may be limited and/or prevented, and overheating of the ESD device 100d when static electricity is introduced may be limited and/or prevented. For example, concentration of current in a portion of the second impurity region 146 in contact with the device isolation structure 152 may be limited and/or prevented. Accordingly, it is possible to limit and/or prevent deterioration of the driving ability of the ESD device due to a phonon scattering phenomenon. In addition, the on-resistance of the ESD device 100d may be reduced, and a low clamping voltage may be implemented even when a large current flows.

According to example embodiments, the first region base well 132 may be configured to surround a lower portion and sides of the first well 134. According to example embodiments, the first well 134 may be spaced apart by a fourth distance d4 in the first direction (the X direction) from the side boundary of the first region base well 132 adjacent to the third separation area A3. For example, the first well 134 may be spaced apart from the inner boundary of the first region base well 132 by a fourth distance d4 in a direction away from the second region base well 142. According to example embodiments, the first well 134 may not overlap the device isolation structure 152 in the vertical direction (the Z direction). According to example embodiments, the fourth distance d4 may be substantially equal to a width length of the first portion P1 in the first direction (X direction).

According to example embodiments, a distance in the first direction (X direction) between the first well 134 and the second region base well 142 may be greater than the distance in the first direction (X direction) between the first region base well 132 and the second region base well 142. According to example embodiments, in a horizontal view, the first region base well 132 may be disposed between the first well 134 and the second base well 124.

In some embodiments, the second base well 124 may have a conductivity type different from that of the first region 130, and a PN junction may be formed between the first region 130 and the second base well 124. In this case, an impurity concentration of the second base well 124 having the second conductivity type may be less than that of the second region base well 142. In some embodiments, the second base well 124 may have the same conductivity type as the first region 130, and a PN junction may be formed between the second region 140 and the second base well 124. In this case, the impurity concentration of the second base well 124 having the first conductivity type may be less than that of the first region base well 132.

According to example embodiments, the first region 130 may have a structure that is gradually doped depending on an ESD current flow direction. For example, in view of the flow direction of the ESD current, the first region base well 132 may be disposed between the first impurity region 136 and the second base well 124, and a first well 134 may be disposed between the first impurity region 136 and the first region base well 132. In this case, an abrupt junction between regions having different conductivity types may be avoided. For example, when the second base well 124 has a conductivity type different from that of the first region 130, an abrupt junction between the first region 130 and the second base well 124 may be limited and/or prevented. For example, When the second base well 124 has the same conductivity type as the first region 130, an abrupt junction between the second base well 124 and the second region 140 may be limited and/or prevented. Accordingly, a high breakdown voltage may be maintained even when the size of the ESD device is reduced by reducing the width length l in the first direction (the X direction) of the device isolation structure 152.

According to example embodiments, a dimension in the first direction (the X direction) of the first portion P1 may be shorter than a dimension in the first direction (the X direction) of the second portion P2. Accordingly, even when the first direction (the X direction) width length l of the device isolation structure 152 is further reduced while maintaining the third distance d3, a low on-resistance characteristic when a forward bias is applied may be stably implemented.

Figure 3F:
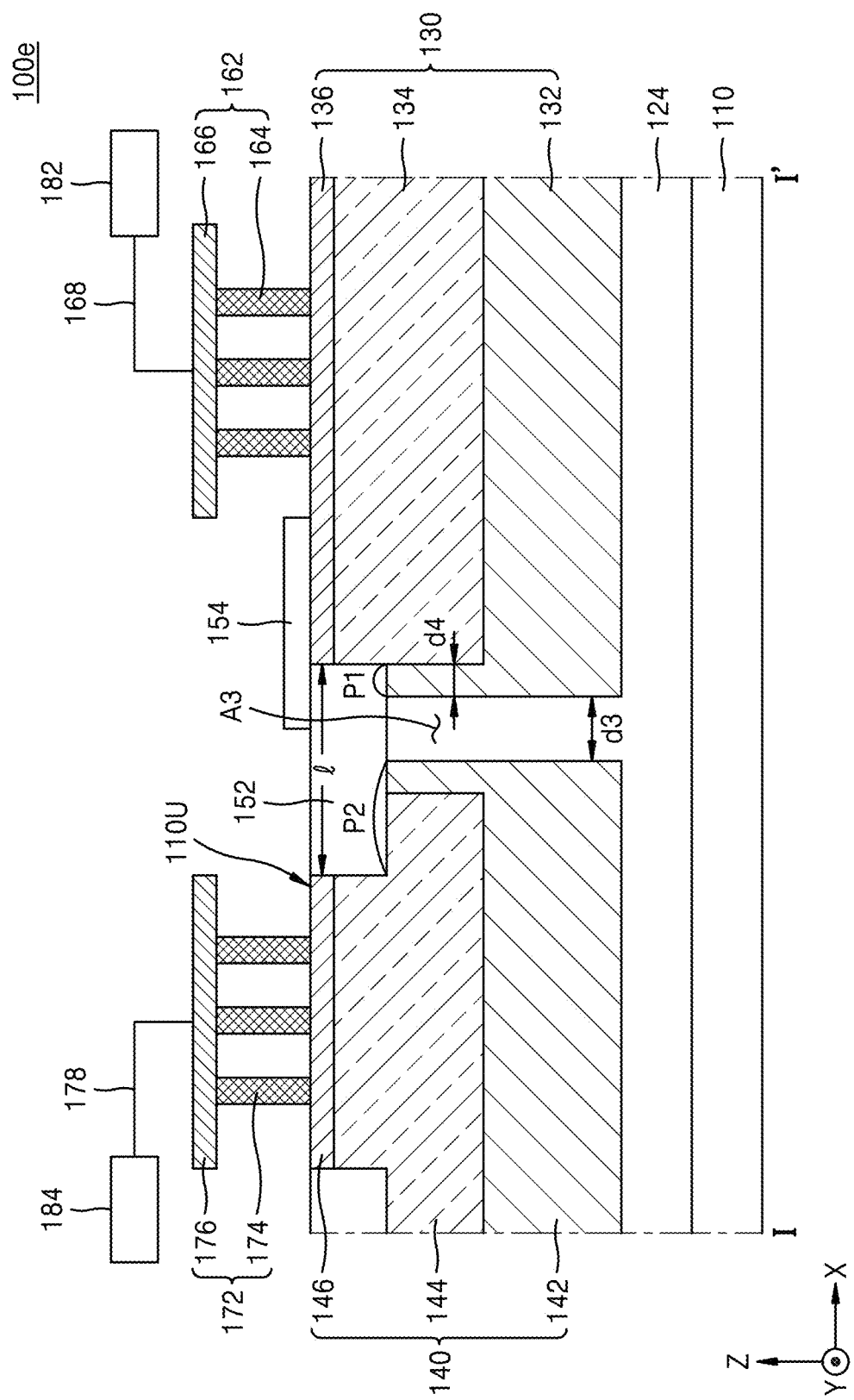
FIG. 3F is a cross-sectional view taken along line I-I' of the ESD device according to some embodiments having the plan views of FIGS. 2A and 2B.

FIG. 3F is a cross-sectional view taken along line I-I' of the ESD device 100e according to some embodiments having the plan views of FIGS. 2A and 2B. The difference between FIGS. 3E and 3F is whether the second well 144 is formed inside the second region base well 142. Hereinafter, the above differences are mainly described.

Referring to FIG. 3F, the ESD device 100e may further include a second well 144 formed inside the second region base well 142. According to example embodiments, the second impurity region 146 may be disposed on the second well 144. According to example embodiments, a vertical depth of the second well 144 may be greater than a vertical depth of the device isolation structure 152.

According to example embodiments, the second region base well 142 may surround sides and lower portions of the second well 144. For example, the second well 144 may be formed in the second region base well 142.

According to example embodiments, the second impurity region 146, the second well 144, and the second region base well 142 may be sequentially disposed in a direction away from an upper surface 110U of a substrate 110 (e.g., in a Z direction). According to example embodiments, an impurity concentration of the second impurity region 146 may be greater than an impurity concentration of the second well 144, and an impurity concentration of the second well 144 may be greater than an impurity concentration of the second region base well 142. In this case, a vertical current flow may be induced to reduce on-resistance when a forward bias is applied. Accordingly, even when the size of the ESD device 100e is reduced, clamping performance when a forward bias is applied may be improved. In addition, an abrupt PN junction is avoided to maintain a high breakdown voltage.

The ESD device 100e according to example embodiments may be manufactured in the same process as other semiconductor devices. For example, the ESD device 100e may share the semiconductor substrate 110 with another semiconductor device, and may be manufactured together in a manufacturing process of the other semiconductor device. According to example embodiments, the multi-well structure of the ESD device 100e including the second base well 124, the first region base well 132, the first well 134, the first impurity region 136, the second region base well 142, the second well 144, and the second impurity region 146 may be formed in the manufacturing process of the other semiconductor device. For example, the ESD device 100e may be manufactured together without additional process operations or masks in a process of manufacturing other semiconductor devices. For example, the other semiconductor device may include a high voltage device and a low voltage device, and the multi-well structure of the ESD device 100e may be manufactured together in an impurity implantation process for implementing a high voltage or a low voltage of the other semiconductor device. Accordingly, the ESD device 100e may be manufactured without an additional increase in process cost.

Figure 3G:
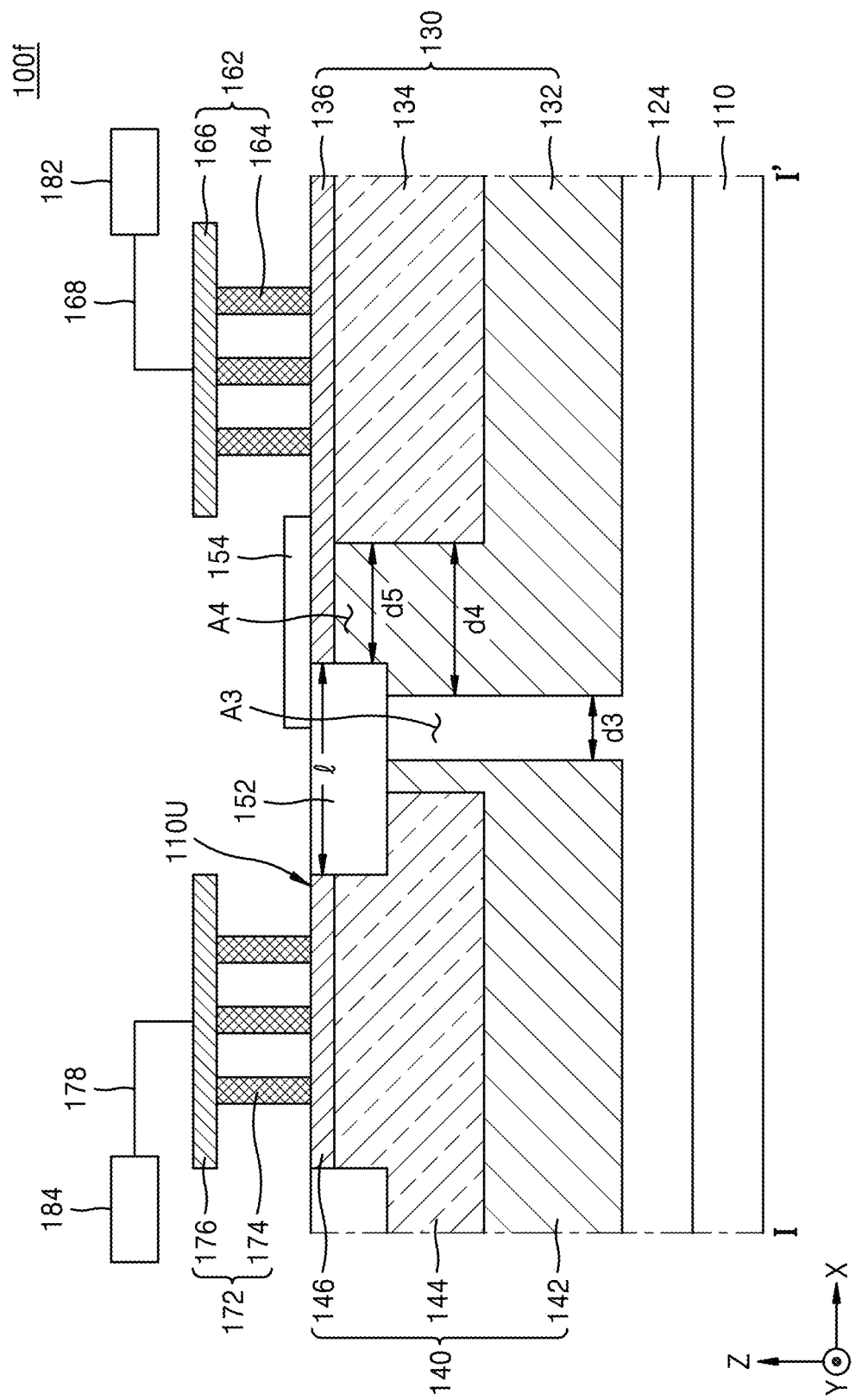
FIG. 3G is a cross-sectional view taken along line I-I' of the ESD device according to some embodiments having the plan views of FIGS. 2A and 2B.

FIG. 3G is a cross-sectional view taken along line I-I' of the ESD device 100f according to other embodiments having the plan views of FIGS. 2A and 2B. The difference between FIGS. 3G and 3F is whether a first well 134 and a device isolation structure 152 are spaced apart from each other in a first direction (an X direction). Hereinafter, the above differences will be mainly described.

Although the ESD device 100f has a first impurity region 136 and a second impurity region 146 of substantially the same area (see FIGS. 2A and 2B), as a first region 130 and a second region 140 have a multi-well structure, in the semiconductor substrate 110, a charge imbalance may occur between the first region 130 and the second region 140 having different conductivity types.

According to example embodiments, the first well 134 may be formed to be narrower in a horizontal direction (an X direction and/or a Y direction) than a first region base well 132. According to example embodiments, the first well 134 may be spaced apart from the device isolation structure 152 by a fifth distance d5 in the first direction (the X direction) under the first impurity region 136. In this case, the volume occupied by the first well 134 in the first region 130 may be reduced, and the charge imbalance between the first region 130 and the second region 140 may be improved. Accordingly, when the reverse bias is applied to ESD device 100f, a breakdown voltage of the ESD device 100f may be further improved.

In some embodiments, the fifth distance d5 of the ESD device 100f of FIG. 3G may be greater than the first distance d1 of the ESD devices 100, 100a, 100b, and 100c of FIGS. 3A to 3D. In some other embodiments, the fifth distance d5 of the ESD device 100f according to FIG. 3G may be less than the first distance d1 between the ESD devices 100, 100a, 100b, and 100c according to FIGS. 3A to 3D.

According to example embodiments, in a horizontal view, a fourth separation area A4 that is a separation area between the device isolation structure 152 and the first well 134 may be formed, and the first region base well 132 may be disposed in the fourth separation area A4. For example, the first region base well 132 may partially contact the lower surface of the first impurity region 136 in the fourth separation area A4. For example, of the first impurity region 136, a portion adjacent to the device isolation structure 152 may be in contact with the first region base well 132, and a portion distant from the device isolation structure 152 by the fifth distance d5 may at least partially contact the first well 134. In this case, a vertical current flow may be induced in a portion of the first impurity region 136, spaced apart from the device isolation structure 152 by the fifth distance d5 in the first direction (the X direction). For example, the resistance between the first impurity region 136 and the first well 134 may be less than the resistance between the first impurity region 136 and the first region base well 132, and the ESD current may be distributed in the first direction (the X direction) without concentrating in a portion adjacent to the device isolation structure 152, of the first impurity region 136. Accordingly, the ESD current flowing down the first impurity region 136 may be distributed in the first direction (the X direction), and damage to the ESD device 100f due to current concentration in the region adjacent to the device isolation structure 152 may be limited and/or prevented.

Figure 3H:
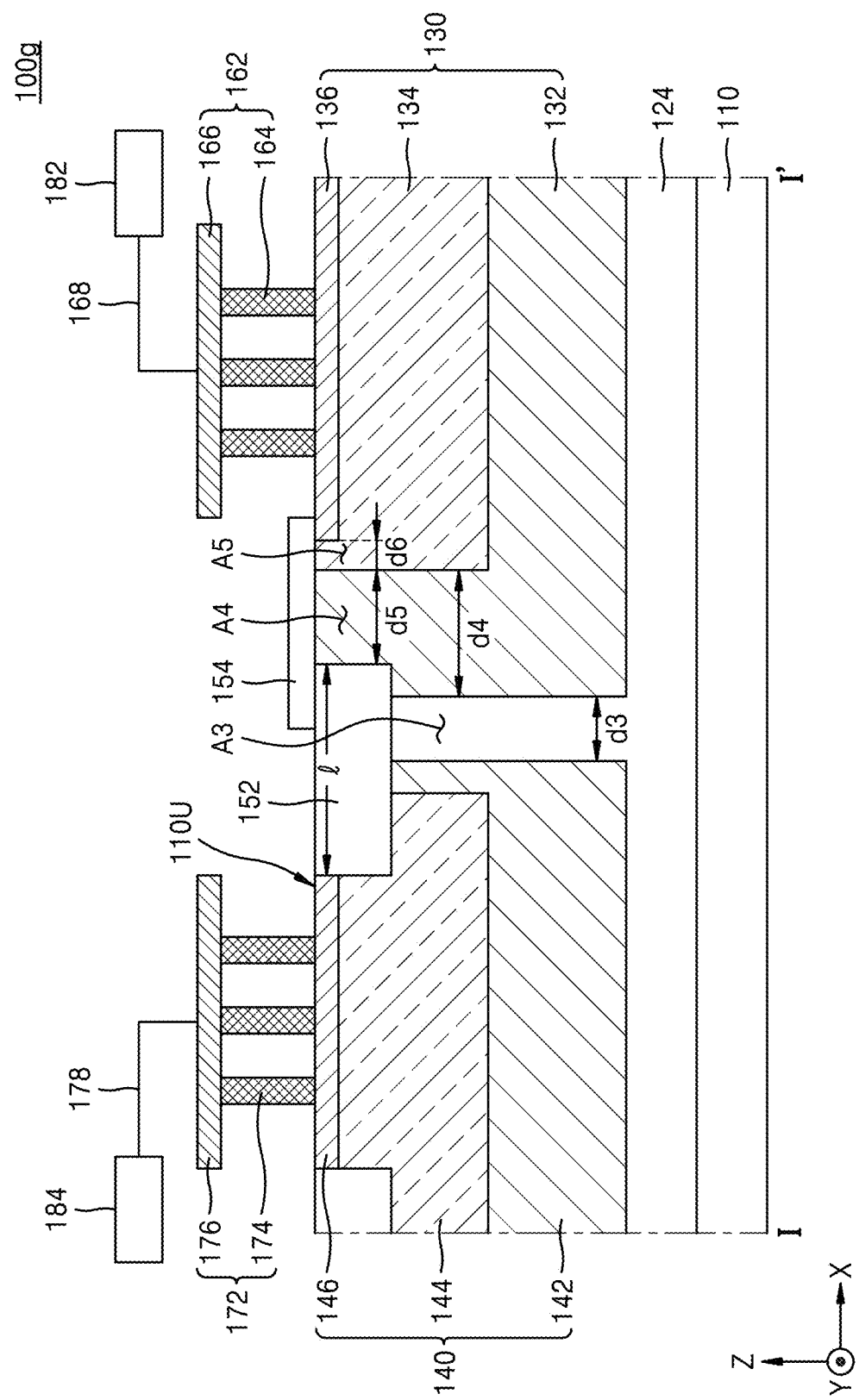
FIG. 3H is a cross-sectional view taken along line I-I' of the ESD device according to some embodiments having the plan views of FIGS. 2A and 2B.

FIG. 3H is a cross-sectional view taken along line I-I' of the ESD device 100g according to some other embodiments having the plan views of FIG. 2A or 2B. The difference between FIGS. 3H and 3G is whether the first impurity region 136 is spaced apart from the device isolation structure 152 in the first direction (X direction). Hereinafter, the above differences will be mainly described.

Referring to FIG. 3H, the first impurity region 136 may be spaced apart from the side boundary of the first well 134 by a sixth distance d6 in the first direction (X direction). For example, the first impurity region 136 may not contact the device isolation structure 152.

According to example embodiments, the first impurity region 136 may be spaced apart from the device isolation structure 152 in the first direction (X direction). According to example embodiments, a separation distance in the first direction (X direction) between the first impurity region 136 and the device isolation structure 152 may be greater than the fifth distance d5 that is the separation distance in the first direction (the X direction) between the first well 134 and the device isolation structure 152.

According to example embodiments, the first impurity region 136 may be formed in the first well 134. According to example embodiments, the first well 134 may surround the side and lower portions of the first impurity region 136. For example, the fourth separation region A4 may not overlap the first impurity region 136 in the vertical direction (Z direction).

According to example embodiments, the side surface of the first impurity region 136 may be spaced apart from the side boundary of the first well 134 by a sixth distance d6 in the first direction (X direction). For example, a side boundary of the first well 134 may be a boundary of the first well 134 facing the fourth separation area A4. For example, the first impurity region 136 may be spaced apart from the device isolation structure 152 in the first direction (X direction) by a distance obtained by adding the fifth distance d5 and the sixth distance d6.

According to example embodiments, in the first direction (X direction), a fifth separation region A5 may be formed between a side boundary of the first impurity region 136 and a side boundary of the first well 134. For example, a portion of the first well 134 may be disposed in the fifth separation area A5. For example, the first impurity region 136 may be spaced apart from the device isolation structure 152 in the first direction (X direction) with the first region base well 132 of the fourth separation area A4 and the first well 134 of the fifth separation area A5 therebetween.

According to example embodiments, the silicide prevention structure 154 may partially cover the device isolation structure 152 and the first impurity region 136. For example, the silicide prevention structure 154 may cover the fourth separation region A4 and the fifth separation region A5 between the device isolation structure 152 and the first impurity region 136.

In some embodiments, the fifth distance d5 may be greater than the sixth distance d6. In some other embodiments, the fifth distance d5 may be less than the sixth distance d6.

In some embodiments, the sixth distance d6 of the ESD device 100g according to FIG. 3H may be less than the second distance d2 of the ESD devices 100, 100a, 100b, and 100c according to FIGS. 3A to 3D. In some other embodiments, the sixth distance d6 of the ESD device 100g according to FIG. 3H may be greater than the second distance d2 of the ESD devices 100, 100a, 100b, and 100c according to FIGS. 3A to 3D.

Figure 3I:
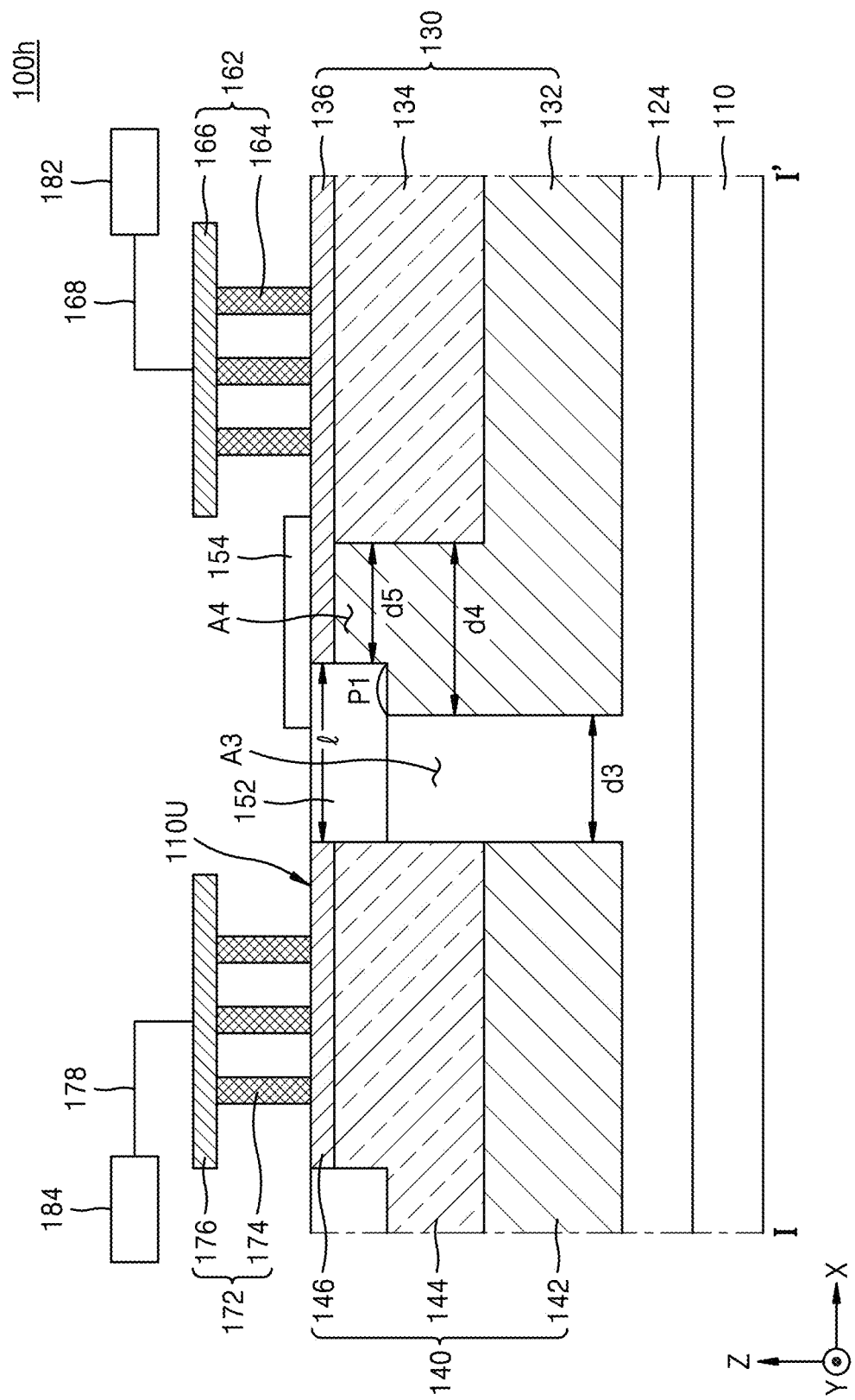
FIG. 3I is a cross-sectional view taken along line I-I' of the ESD device according to some embodiments having the plan views of FIGS. 2A and 2B.

FIG. 3I is a cross-sectional view taken along line I-I' of the ESD device 100h according to other embodiments having the plan views of FIGS. 2A and 2B. The difference between FIGS. 3G and 3I is whether a portion of the second region 140 adjacent to the first region 130 vertically overlaps the device isolation structure 152.

Referring to FIG. 3I, the device isolation structure 152 between the first impurity region 136 and the second impurity region 146 may not overlap the second region base well 142 and the second well 144 in the vertical direction (the Z direction). For example, the device isolation structure 152 between the first impurity region 136 and the second impurity region 146 may not overlap the second region 140 in the vertical direction (the Z direction).

In some embodiments, in the ESD device 100h, a well structure including the first region 130 and the second region 140 may be first formed, and then the device isolation structure 152 may be formed. For example, after the active region 102 is formed on the semiconductor substrate 110, the field region 101 may be formed.

In some other embodiments, after the device isolation structure 152 is first formed on the semiconductor substrate 110, a well structure may be formed through an impurity implantation process. In some embodiments, the second region 140 may not overlap the device isolation structure 152 in a substantially vertical direction (the Z direction), and accordingly, it is possible to limit and/or prevent an implant profile from being non-uniformly formed in the lower region of the device isolation structure 152.

Figure 4:
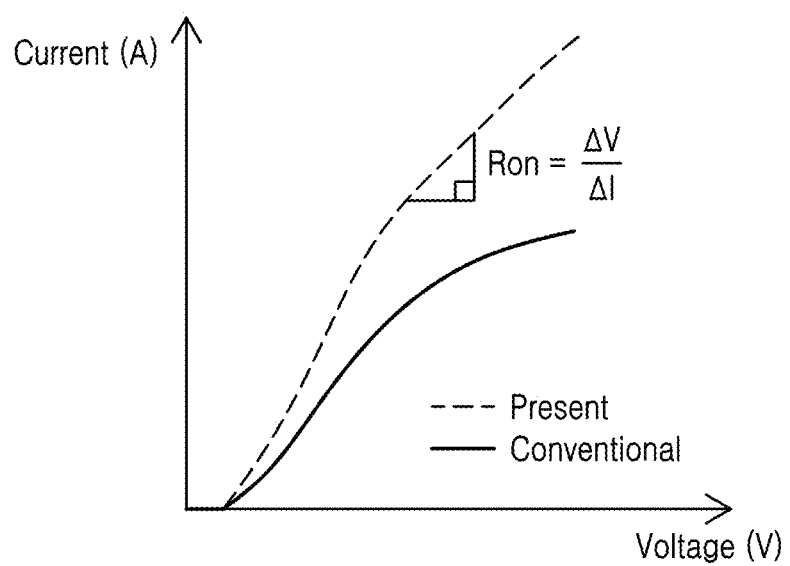
FIG. 4 is a graph showing the on-resistance characteristics of an ESD device having a conventional P-type diode structure and an ESD device having a P-type diode structure according to example embodiments.

FIG. 4 is a graph showing the on-resistance (Ron) characteristics of a conventional ESD device having a P-type diode structure and the first ESD device 100-1 having the P-type diode structure of FIGS. 3A to 3B. The X axis represents a voltage applied between the first impurity region 136 and the second impurity region 146, and the Y axis represents a current according to the voltage application. The solid line indicates an ESD device having a conventional P-type diode structure, and the dashed line indicates the first ESD device 100-1 according to example embodiments. The graph of FIG. 4 shows data when the conventional ESD device having a P-type diode structure and the first ESD device 100-1 according to example embodiments have the same size.

For example, the conventional P-type ESD device may not have a structure in which the first well 134 is spaced apart from the device isolation structure 152 in the first direction (the X direction) like the example ESD device 100 of inventive concepts according to FIG. 3A.

For example, like the ESD device 100b according to the example embodiments shown in FIG. 3C, the conventional P-type ESD device may not have a structure in which the first impurity region 136 is spaced apart from the device isolation structure 152 in the first direction (the X direction) and is surrounded by the first well 134.

For example, like the example ESD device 100b of inventive concepts according to FIG. 3E, the conventional P-type ESD device may not have a structure in which the first region 130 and the second region 140 having different conductivity types are separated in the first direction (X direction). For example, the conventional P-type ESD device may not include the first region 130 and the second region 140 of the multi-well structure. For example, like the example ESD device 100d of inventive concepts according to FIG. 3G, the conventional P-type ESD device may not have a structure in which the first well 134 is spaced apart from the device isolation structure 152 in the first direction (X direction) in the first region base well 132.

Referring to FIG. 4, the amount of current change with respect to the amount of voltage change indicated by the slope of the graph may be greater in the first ESD device 100-1 according to example embodiments than in the conventional P-type ESD device. On-resistance may be calculated as the amount of voltage change with respect to the amount of current change, and the first ESD device 100-1 according to example embodiments may have a smaller on-resistance compared to the conventional P-type ESD device.

Figure 5:
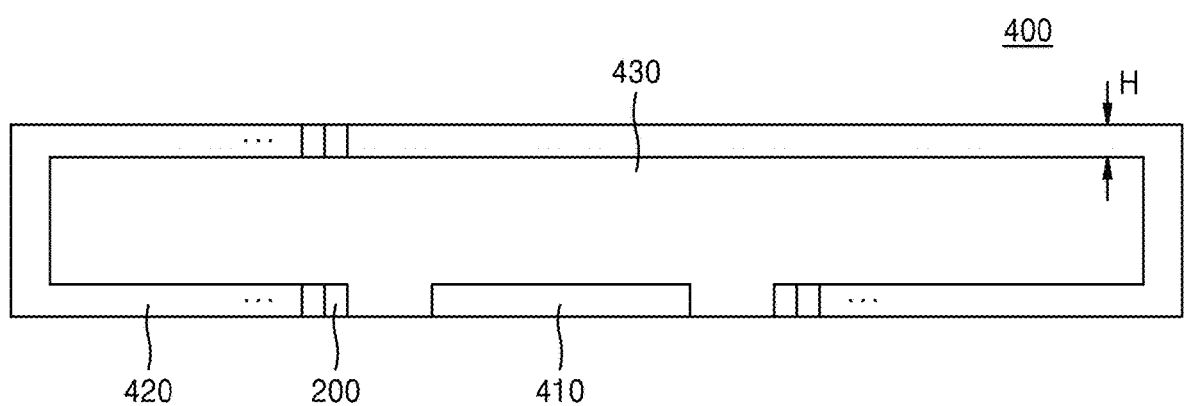
FIG. 5 is a plan view illustrating a display driving chip including an ESD device according to some embodiments.

FIG. 5 is a plan view illustrating a display driving chip 400 including the ESD device 100 according to some embodiments.

Referring to FIG. 5, the display driving chip 400 may include an input area 410, an output area 420, and a circuit area 430. According to example embodiments, the circuit area 430 may include a display driving integrated circuit (DDI). For example, the circuit area 430 may be configured to generate a driving signal of the display panel. According to example embodiments, the input area 410 may be configured to receive a control signal from the outside of the display driving chip 400 and supply the control signal to the DDI. According to example embodiments, the input area 410 may include a plurality of I/O pads 304 (see FIG. 1), a plurality of power pads, a plurality of ground pads, and a plurality of ESD devices 100. According to example embodiments, the output area 420 may be configured to supply a signal of the display driving integrated circuit to an external device (e.g., a display panel). According to example embodiments, the output area 420 may include a plurality of I/O pads 304, a plurality of power pads, a plurality of ground pads, and a plurality of ESD devices 100.

According to example embodiments, the circuit area 430 may be disposed in the center of the display driving chip 400. According to example embodiments, the input area 410 and the output area 420 may be disposed at an edge of the display driving chip 400. For example, the display driving chip 400 may have a rectangular shape having two long sides and two short sides. For example, the input area 410 may be partially disposed on any one of the two long sides, and the output area 420 may be disposed on an edge area of the display driving chip 400 excluding the input area 410. For example, the output area 420 may be disposed to be spaced apart from the input area 410 by a desired and/or alternatively predetermined distance. For example, in FIG. 5, the output area 420 is shown to extend as one area, but the output area 420 may be divided into a plurality of areas and disposed at the edge area of the display driving chip 400. In this case, the plurality of output areas 420 may be disposed to be spaced apart from each other. According to example embodiments, the output area 420 may be disposed to surround the circuit area 430 at the edge of the display driving chip 400.

According to example embodiments, the output area 420 may include a plurality of cells 200. According to example embodiments, a plurality of cells 200 may be arranged along an edge of the display driving chip 400 and may be arranged to surround the DDI. In FIG. 5, the plurality of cells 200 are shown, and for example, the protection target device 302 in the equivalent circuit diagram of FIG. 1, may be the DDI. The cell 200 according to the example embodiments may include the ESD devices 100 according to the above-described embodiments, and may implement improved ESD protection performance and have a reduced size compared to the size of the cell according to the prior art. For example, while the first direction (the X direction) length l of the device isolation structure 152 is reduced (see FIGS. 3A to 3I), a stable clamping voltage and a breakdown voltage may be implemented. Accordingly, a width H of the output area 420 may be reduced, and the area of the display driving chip 400 may be reduced.

While inventive concepts have been particularly shown and described with reference to embodiments in the present application, it will be understood that various changes in form and details may be made therein without departing from the spirit and scope of inventive concepts in the following claims.

What is claimed is:

1. An electrostatic discharge (ESD) device comprising:
a semiconductor substrate including a first impurity region having a first conductivity type, a second impurity region having a second conductivity type, a first base well, and a first well in the first base well, the second conductivity type opposite the first conductivity type; and
a device isolation structure between the first impurity region and the second impurity region, wherein
in a plan view, the first base well surrounds the first impurity region, the second impurity region, and lower portions of the device isolation structure in the semiconductor substrate,
the first well has the first conductivity type,
the first well is spaced apart from the device isolation structure in a first direction with a portion of the first base well therebetween,
the first base well comprises a first region base well under the first impurity region and a second region base well under the second impurity region, and
the first region base well and the second region base well are spaced apart from each other in the first direction under the device isolation structure.

2. The ESD device of claim 1, wherein
the first well is spaced apart from the device isolation structure in the first direction,
a portion of the first region base well is between the device isolation structure and the first well.

3. The ESD device of claim 2, wherein
the semiconductor substrate further includes a second well having the second conductivity type in the second region base well, and
the second impurity region is on the second well.

4. The ESD device of claim 2, wherein
an impurity concentration of the first impurity region is greater than an impurity concentration of the first well, and
the impurity concentration of the first well is greater than an impurity concentration of the first region base well.

5. The ESD device of claim 2, wherein
the device isolation structure includes a first portion overlapping the first region base well and a second portion overlapping the second region base well in a vertical direction, and
a first dimension of the first portion in the first direction is less than a first dimension of the second portion in the first direction.

6. The ESD device of claim 1, wherein
the semiconductor substrate further includes a second base well surrounding the first base well in the semiconductor substrate.

7. A display driving chip comprising:
a circuit area;
an input area; and
an output area,
wherein the output area includes a plurality of cells, and each of the plurality of cells include the ESD device according to claim 1.

8. An electrostatic discharge (ESD) device comprising:
a semiconductor substrate including a first region and a second region,
the first region including a first region base well having a first conductivity type, a first well having the first conductivity type in the first region base well, and a first impurity region having the first conductivity type on the first well and connected to a first electrode,
the second region including a second region base well having a second conductivity type, and a second impurity region having the second conductivity type and on the second region base well connected to a second electrode,
the second conductivity type opposite the first conductivity type; and
a device isolation structure between the first impurity region and the second impurity region,
wherein the first region and the second region are spaced apart from each other in a first direction,
the semiconductor substrate further includes a second well having the second conductivity type in the second region base well, and
the second impurity region is on the second well.

9. The ESD device of claim 8, wherein the first well is spaced apart from the device isolation structure in the first direction.

10. The ESD device of claim 8, wherein
the first region base well is between the first well and the device isolation structure, and
the first impurity region partially contacts the first region base well and the first well.

11. A display driving chip comprising:
a circuit area;
an input area; and
an output area,
wherein the output area includes a plurality of cells, and
each of the plurality of cells include the ESD device according to claim 8.

12. The ESD device of claim 8, wherein
an impurity concentration of the second impurity region is greater than an impurity concentration of the second well, and
the impurity concentration of the second well is greater than an impurity concentration of the second region base well.

13. The ESD device of claim 8,
wherein the first conductivity type is P-type,
the second conductivity type is N-type,
the first electrode is electrically connected to an input/output pad, and
the second electrode is electrically connected to a power pad.

14. The ESD device of claim 8, wherein
the first conductivity type is N-type,
the second conductivity type is P-type,
the first electrode is electrically connected to an input/output pad, and
the second electrode is electrically connected to a ground pad.

15. A display driving chip comprising:
a circuit area;
an input area; and
an output area,
wherein the output area includes a plurality of cells including an electrostatic discharge (ESD) device,
wherein the ESD device comprises
a P-type semiconductor substrate,
an N-type base well in the P-type semiconductor substrate,
a first region base well having a first conductivity type in the N-type base well,
a second region base well having a second conductivity type in the N-type base well, the second conductivity type being opposite the first conductivity type,
a first well having the first conductivity type in the first region base well, a second well having the second conductivity type in the second region base well,
a first impurity region having the first conductivity type on the first well and connected to a first electrode,
a second impurity region having the second conductivity type on the second well and connected to a second electrode,
a device isolation structure between the first impurity region and the second impurity region, and
a silicide prevention structure at least partially overlapping the first impurity region and the device isolation structure on the first impurity region and the device isolation structure,
wherein the first region base well and the second region base well are spaced apart from each other in a first direction in the N-type base well, and
the first well is spaced apart from the device isolation structure in the first direction in the first region base well.

16. The display driving chip of claim 15, wherein
the ESD device has a bar-type structure in which the first impurity region and the second impurity region each extend in a second direction perpendicular to the first direction.

17. The display driving chip of claim 15, wherein
the ESD device has a wrap-around-type structure in which the first impurity region is at a center region of the ESD device and the second impurity region surrounds the first impurity region.

18. The display driving chip of claim 15, wherein
the circuit area includes a display driving integrated circuit, and
the plurality of cells surround the display driving integrated circuit at an edge of the display driving chip.

* * * * *